United States Patent
Varnak et al.

(10) Patent No.: US 9,823,276 B2
(45) Date of Patent: Nov. 21, 2017

(54) PROCESS CONTROL LOOP CURRENT VERIFICATION

(75) Inventors: Valentin G. Varnak, Chelyabinsk (RU); Pavel P. Schmidt, Chelyabinsk (RU); Leonid I. Belov, Chelyabinsk (RU)

(73) Assignee: Rosemount Inc., Chanhassen, MN (US)

( * ) Notice: Subject to any disclaimer, the term of this patent is extended or adjusted under 35 U.S.C. 154(b) by 1179 days.

(21) Appl. No.: 13/816,333

(22) PCT Filed: May 29, 2012

(86) PCT No.: PCT/RU2012/000422
§ 371 (c)(1),
(2), (4) Date: Feb. 11, 2013

(87) PCT Pub. No.: WO2013/180591
PCT Pub. Date: Dec. 5, 2013

(65) Prior Publication Data
US 2013/0325381 A1  Dec. 5, 2013

(51) Int. Cl.
*G01R 19/00* (2006.01)
*G05B 23/02* (2006.01)
(Continued)

(52) U.S. Cl.
CPC ..... *G01R 19/0092* (2013.01); *G05B 23/0235* (2013.01); *G08C 19/02* (2013.01);
(Continued)

(58) Field of Classification Search
CPC .................................................. G01R 19/0092
(Continued)

(56) References Cited

U.S. PATENT DOCUMENTS

| 1,577,388 A | 3/1926 | Twyman |
| 5,032,772 A | 7/1991 | Gully et al. |

(Continued)

FOREIGN PATENT DOCUMENTS

| CN | 1799013 | 7/2006 |
| CN | 101031852 | 9/2007 |

(Continued)

OTHER PUBLICATIONS

Office Action from Chinese Patent Application No. 201310063286.3 dated Jun. 1, 2015.
(Continued)

*Primary Examiner* — Ricky Ngon
(74) *Attorney, Agent, or Firm* — Westman, Champlin & Koehler, P.A.

(57) ABSTRACT

Some embodiments are directed to a process device comprising a process variable sensor configured to generate an output signal indicative of a sensed process variable; loop current output circuitry configured to control a loop current on a two wire process control loop to a value based on the output signal; loop current measurement circuitry coupled to the process control loop and configured to generate a measured loop current value based on the loop current; and loop current verification circuitry configured to approximate the loop current value based on the output signal and properties of a low pass filter, and generate a diagnostic signal based on a comparison of the approximated loop current value and the measured loop current value.

15 Claims, 7 Drawing Sheets

(51) Int. Cl.
 *G08C 19/02* (2006.01)
 *H04Q 9/00* (2006.01)
 *G01R 19/25* (2006.01)
 *G01R 31/28* (2006.01)
 *G05B 19/042* (2006.01)

(52) U.S. Cl.
 CPC .......... *H04Q 9/00* (2013.01); *G01R 19/2509* (2013.01); *G01R 31/2829* (2013.01); *G05B 19/0425* (2013.01); *G05B 2219/25428* (2013.01); *G05B 2219/33197* (2013.01); *G05B 2219/33331* (2013.01); *H04Q 2209/823* (2013.01)

(58) Field of Classification Search
 USPC .......................................................... 702/64
 See application file for complete search history.

(56) References Cited

U.S. PATENT DOCUMENTS

| | | | | |
|---|---|---|---|---|
| 6,601,005 | B1* | 7/2003 | Eryurek | G01K 15/00 |
| | | | | 374/E15.001 |
| 7,010,459 | B2 | 3/2006 | Eryurek et al. | |
| 7,280,048 | B2 | 10/2007 | Longsdorf et al. | 340/664 |
| 7,298,101 | B2 | 11/2007 | Watts et al. | |
| 7,991,582 | B2 | 8/2011 | Longsdorf et al. | |
| 8,825,422 | B2 | 9/2014 | Chemisky et al. | |
| 2005/0030185 | A1* | 2/2005 | Huisenga | G01R 19/2509 |
| | | | | 340/635 |
| 2005/0030186 | A1 | 2/2005 | Huisenga et al. | 340/635 |
| 2005/0168343 | A1* | 8/2005 | Longsdorf | G01R 19/2509 |
| | | | | 340/664 |
| 2010/0305896 | A1* | 12/2010 | Chemisky | G05B 23/0235 |
| | | | | 702/85 |
| 2012/0086474 | A1* | 4/2012 | Idiart | H03M 1/1071 |
| | | | | 327/70 |
| 2012/0278042 | A1 | 11/2012 | Matzen | |

FOREIGN PATENT DOCUMENTS

| | | |
|---|---|---|
| CN | 101147181 | 3/2008 |
| CN | 101896792 | 11/2010 |
| DE | 10 2007 059 847 A1 | 6/2009 |
| DE | 10 2007 062 919 A1 | 6/2009 |
| DE | 10 2009 050 645 A1 | 4/2011 |
| DE | 10 2010 041731 A1 | 4/2012 |
| EP | 0 213 767 A2 | 3/1987 |
| JP | 6-209493 | 7/1994 |
| JP | 11-132812 | 5/1999 |
| JP | 2012-99088 | 5/2012 |
| RU | 62754 | 11/2005 |
| RU | 2350975 | 3/2009 |
| WO | WO 2011/005938 | 1/2011 |

OTHER PUBLICATIONS

Office Action from Canadian Patent Application No. 2,873,034 dated Jan. 15, 2016.
Office Action from Japanese Patent Application No. 2015-514951 dated Jan. 5, 2016.
Communication from Russian Patent Application No. 2014153145, dated Feb. 20, 2016.
Communication from European Patent Application No. 12814008. 4, dated Jan. 16, 2015.
International Search Report and Written Opinion for PCT Application No. PCT/RU2012/000422, dated Feb. 20, 2013, 12 pages.
Office Action from Japanese Patent Application No. 2015-514951, dated Aug. 9, 2016.
Office Action from Canadian Patent Application No. 2,873,034, dated Jan. 3, 2017.

* cited by examiner

PROCESS CONTROL LOOP CURRENT VERIFICATION

CROSS-REFERENCE TO RELATED APPLICATION

This Application is a Section 371 National Stage Application of International Application No. PCT/RU2012/000422, filed 29 May 2012 not yet published, the contents of which are hereby incorporated by reference in their entirety.

BACKGROUND

The present disclosure relates to process devices used in process control and monitoring systems. More specifically, the present disclosure relates to performing loop current diagnostics to identify errors in a process device.

Process variable transmitters are used to measure process parameters (or process variables) in a process control or monitoring system, and transmit the measurement to a control room. For example, information related to pressure of process fluid may be transmitted to a control room and used to control the process, such as oil refining.

The transmission of the process variable measurement is often performed over a two-wire process control loop. In such a process control loop, current is supplied from a current source at a location such as in the control room, and the transmitter controls the current flowing in the loop from its remote location in the field. For example, a 4 mA signal can be used to indicate a zero reading and a 20 mA signal can be used to indicate a full scale reading. The same two wires can also be used to power the transmitter.

More recently, transmitters have employed digital circuitry which communicates with the control room using a digital signal which is superimposed onto the analog current signal flowing through the process control loop. One example of such a technique is the HART® communication protocol. The HART® protocol, and other such protocols typically, include a set of commands or instructions which can be sent to the transmitter to elicit a desired response, such as transmitter control or interrogation.

When an analog loop current is used to represent information such as a process variable, the accuracy at which the loop current can be set can be a limiting factor on the accuracy of the transmitted process variable. As the transmitter ages, the ability of the transmitter to control the loop current to accurately represent the process variable measurement can degrade. Accordingly, it is desirable to periodically perform a diagnostic test on the transmitter by checking that the loop current is an accurate representation of the process variable measurement. Exemplary devices that perform this diagnostic function are described in U.S. Pat. No. 7,280,048 and U.S. Publication 2005/0030186, which are assigned to Rosemount Inc. of Chanhassen, Minn.

The diagnostic tests performed by a transmitter need to be as accurate as possible in order to prevent falsely identifying a transmitter as failing. Conventional transmitter diagnostic tests may falsely identify a transmitter as failing during periods when the processes variable is changing. The changing process variable can result in a transmitter setting a loop current to a value that differs from the process variable measurement even though the transmitter is operating properly.

SUMMARY

A process device comprising a process variable sensor configured to generate an output signal indicative of a sensed process variable; loop current output circuitry configured to control a loop current on a two wire process control loop to a value based on the output signal; loop current measurement circuitry coupled to the process control loop and configured to generate a measured loop current value based on the loop current; and loop current verification circuitry configured to approximate the loop current value based on the output signal and properties of a low pass filter, and generate a diagnostic signal based on a comparison of the approximated loop current value and the measured loop current value.

DETAILED DESCRIPTION OF ILLUSTRATIVE EMBODIMENTS

Embodiments of the present invention provide verification that an analog output converted from a digital measured value accurately reflects the measured digital value. In one exemplary implementation, embodiments of the invention provide verification that an analog output, such as current (e.g., 4-20 mA, 0-20 mA) or voltage (e.g., 1-5V, 0-5V), applied to a process control loop by a process device is set to a value that accurately reflects the desired value. The invention can be implemented in any process device which is used to control current in a process control loop and is not limited to the illustrative process device discussed herein. For example, one process device described herein is a process variable transmitter which includes a sensor for sensing a process variable. The transmitter controls the current flowing through the process control loop to an analog value which is representative of the sensed process variable. However, it is understood that it is not necessary for a process device to sense a process variable in order to implement various aspects of the present invention. Embodiments of the invention may also be used for diagnostics in other systems where analog outputs are converted from a digital signal. For instance, embodiments of the invention may be used to perform diagnostics in the Rosemount 333 HART® Tri-Loop converter, which reads the HART® digital information (primary, secondary and other variables) from a multivariable transmitter and converts it into three analog output signals (e.g., 4-20 mA signals).

Figure 1:
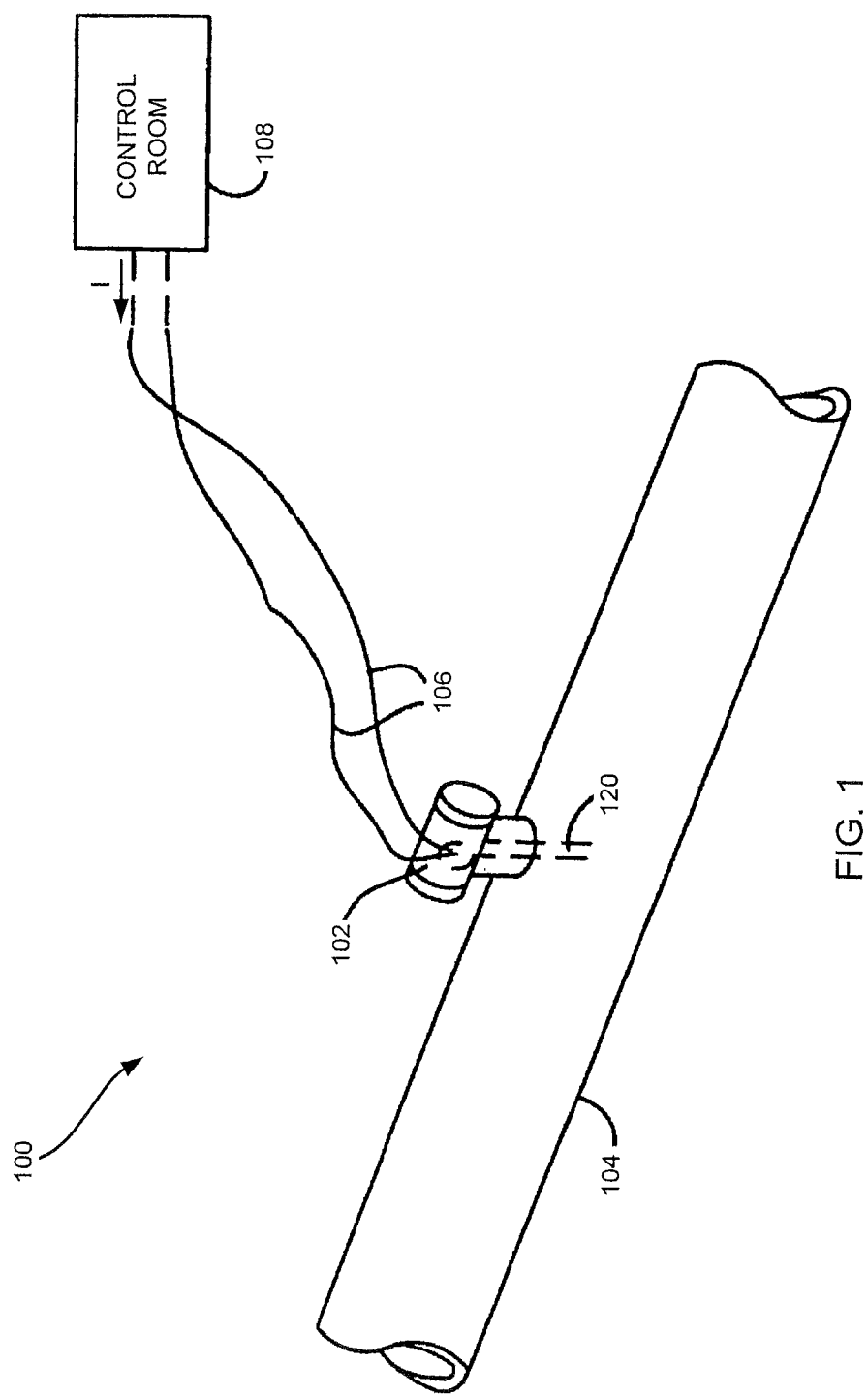
FIG. 1 is a diagram of process control system which includes a process variable transmitter connected to process pipe.

FIG. 1 is a diagram of an exemplary process control system 100 which includes a process device 102 in the form of a process variable transmitter, which is connected to a process pipe 104. Process device 102 is coupled to a two wire process control loop 106 which operates in accordance with a proprietary or standard protocol, such as the HART® the communication protocol. However, the invention is not limited to this standard.

The two wire process control loop 106 runs between process device 102 and a control room 108. In one embodiment, the loop 106 can carry a current I which is representative of a sensed process variable which is sensed using a process variable sensor 120. Additionally, the loop 106 can operate in accordance with other protocols such as the HART® protocol, which allows a digital signal to be superimposed on the current through loop 106, such that digital information can be sent to or received from the process device 102.

Figure 2:
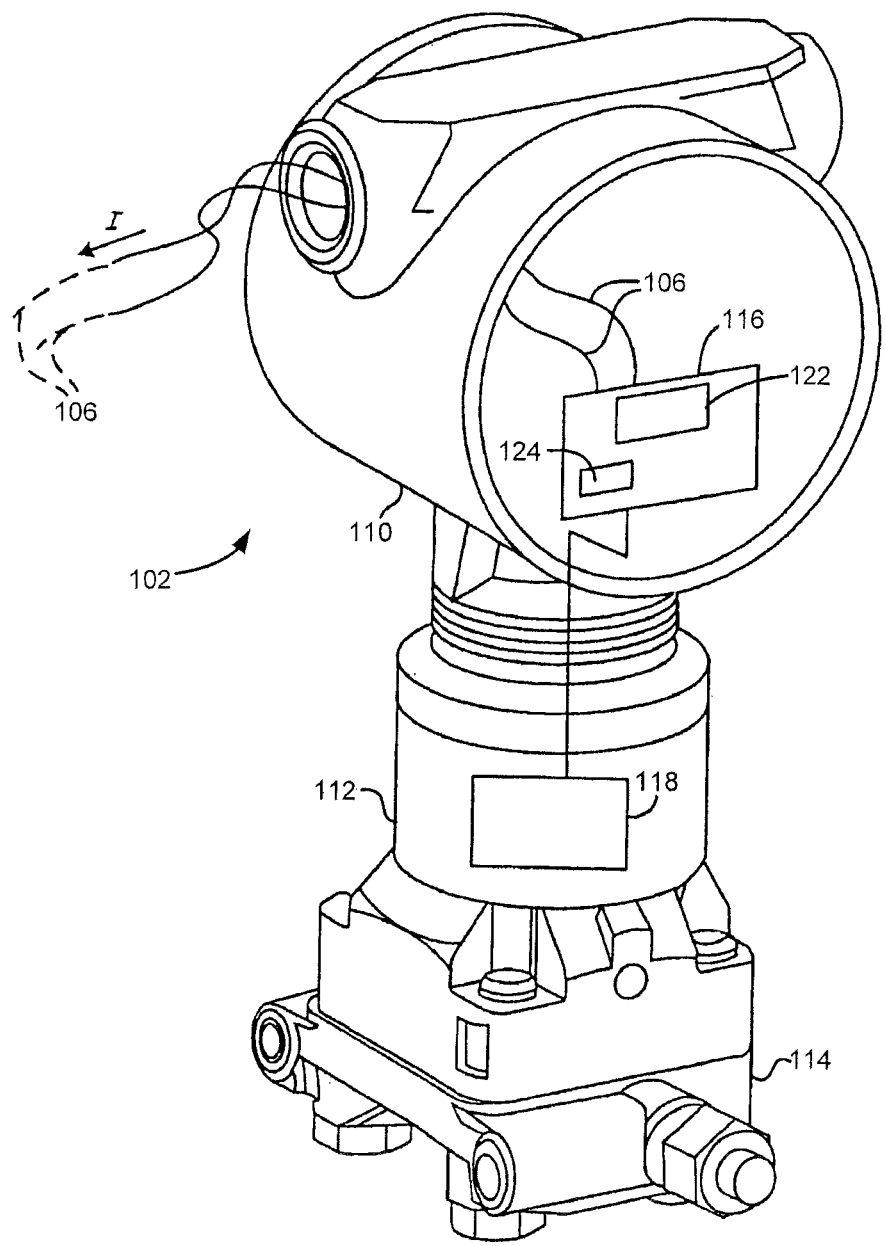
FIG. 2 is a perspective view of a process variable transmitter which shows one exemplary configuration of circuitry blocks carried therein.

FIG. 2 is a perspective view of process device 102 which shows one exemplary configuration of circuitry blocks carried therein. In this exemplary embodiment, process device 102 includes a transmitter module 110 which couples to a sensing module 112. The sensing module 112 couples to the process piping 104 (shown in FIG. 1) through a manifold process coupling 114.

The transmitter module 110 includes transmitter module electronic circuitry 116, which couples to sensing module electronic circuitry 118 carried in sensing module 112. Typically, the sensing module electronic circuitry 118 couples to a process variable sensor, for example sensor 120 (FIG. 1), which is used to sense a process variable related to operation of the process. The transmitter module electronic circuitry 116 includes loop current output circuitry 122, and loop current verification circuitry 124. The circuitry 124 can be implemented in hardware, software or a hybrid combination of the two and can be located anywhere within process device 102.

During operation, loop current output circuitry 122 controls the value of the current I flowing through loop 106 to represent, for example, a measured process variable. This can be used to monitor or control operation of an industrial process. In some applications, output circuitry 122 is also used to provide power to circuitry within process device 102, which is generated using power received over loop 106, in accordance with conventional techniques. In some applications, such as for obtaining a Safety Integrity Level (SIL) certification, it is necessary for the process device 102 to meet certain reliability criteria. For example, in order to ensure that a process is shut down upon a failure or impending failure, some certifications require that an alarm signal be properly sent so that a safety shut down can occur even if some of the components have failed in process device 102. The loop current verification circuitry 124 can be applicable to such a configuration.

Figure 3:
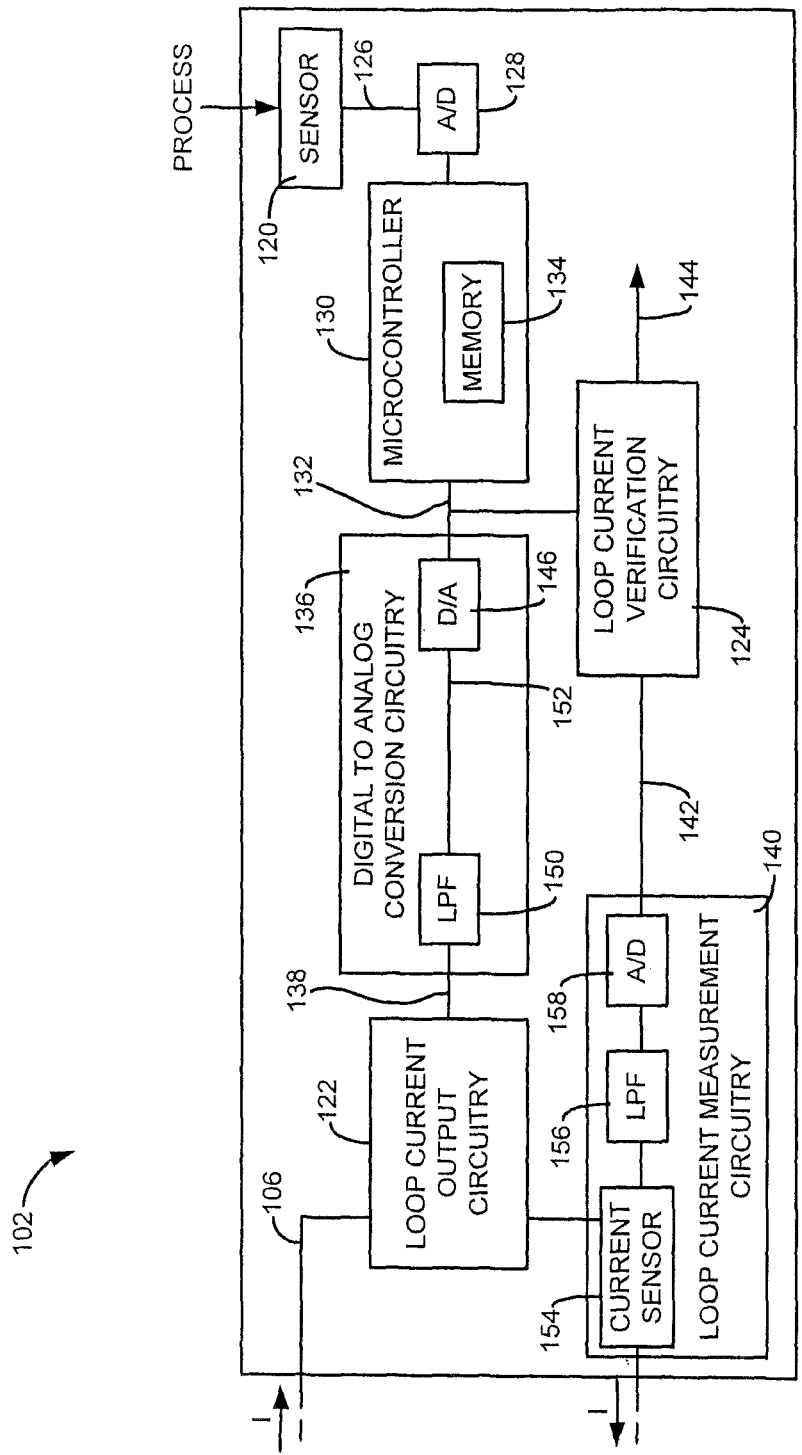
FIG. 3 is a simplified block diagram of a process device in accordance with embodiments of the invention.

FIG. 3 is a simplified block diagram of a process device 102 in accordance with embodiments of the invention. In some embodiments, the process device 102 include a process variable sensor 120 that couples to a process and is configured to produce an output signal 126 that is indicative of a measurement of the sensed process. The process device 102 also includes measurement circuitry that provides initial processing of the measurement signal 126. In one embodiment, the measurement circuitry comprises an analog-to-digital converter 128, which converts the analog output signal 126 to a digital measurement signal. In one embodiment, the measurement circuitry includes one or more microprocessors represented by microcontroller 130 that processes the digital measurement signal from the converter 128, and outputs a digital measured value 132. The measurement circuitry may also include memory 134 that may contain, for example, stored values for use by the microcontroller 128 to process the digitized sensor output signal, program instructions that are executable by the one or more processors to perform method steps and other functions described herein.

In some embodiments, the process device 102 includes digital-to-analog conversion circuitry 136 that converts the digital measured value 132 into an analog measured value 138. The analog measured value 138 is provided to loop current output circuitry 122, which controls the loop current I in the two wire process control loop 106 as a function of the analog measured value 138, in accordance with conventional techniques.

In one embodiment, the process device 102 includes loop current measurement circuitry 140 that is coupled to the process control loop 106, and is configured to generate a measured loop current value 142 that is based on the loop current I. In one embodiment, the process device 102 includes loop current verification circuitry 124, which is generally configured to compare the measured loop current value 142 with the digital measured value 132, and responsively generate a diagnostic signal 144 related to the comparison. For instance, the loop current verification circuitry 124 may provide a diagnostic signal 144 indicating that the loop current I is outside of a predetermined or adjustable threshold of its intended value indicated by the digital measured value 132. The set threshold may be based upon a fixed threshold value, or based upon a percentage discrepancy, or other relationship with the intended value 132 of the loop current I. In addition, the diagnostic signal 144 can be an indication of the amount of error, in absolute or relative terms, of the actual loop current I versus the desired output loop current value 132. The diagnostic signal 144 can be communicated over the two wire process control loop 106 in accordance with conventional techniques.

One embodiment of the digital-to-analog conversion circuitry 136 includes a digital-to-analog converter 146 and a low pass filter 150. The digital-to-analog converter 146 converts the digital measured value 132 to an analog signal 152. The signal 152 is passed through the low pass filter 150 to produce the analog measured value 138.

One embodiment of the loop current measurement circuitry 140 includes a current sensor 154 or other device for measuring the loop current I in the two wire process control loop 106. The current sensor 154 may measure the loop current I through the measurement of a voltage across a resistance that is in series with the loop current I, or other suitable conventional technique. In one embodiment, the output from the current sensor 154 is passed through a low pass filter 156 and to an analog-to-digital converter 158 to form the measured loop current value 142 that is provided to the loop current verification circuitry 124. The low pass filter 156 generally operates to remove high frequency noise from the loop current measurement 102 before processing by the analog-to-digital converter 158.

As mentioned above, the loop current verification circuitry 124 compares the loop current I with the desired value of the loop current. In one embodiment, the desired value of the loop current is represented by the digital measured value 132, which is representative of the sensor output 126. The loop current verification circuitry 124 receives the digital measured value 132 through a suitable connection, as indicated in FIG. 3.

In accordance with another example, the process device 102 can enter a test mode, in which the loop current I through the two wire process control loop 106 is set to one or more predetermined loop currents, or to a pattern of loop currents. During this test mode, the loop current verification circuitry 124 can compare the actual loop current I flowing through the process control loop 106 with a reference that is representative of the predetermined loop current, rather than the digital measured value 132. Accordingly, while the exemplary diagram of the process device 102 indicates that the digital measured value 132 is provided to loop current verification circuitry 124, it is understood that a reference digital measured value corresponding to the predetermined loop current I generated while the process device 102 is in a test mode, may alternatively be provided to the loop current verification circuitry 124. Hereinafter, both the digital measured value and the reference signal indicative of the predetermined test mode loop current I, will be referred to as the digital measured value 132.

In order for the loop current verification circuitry 124 to produce a diagnostic signal 144 that accurately represents an error between the desired value of the loop current I indicated by the measured digital value 132 and the actual loop current I, the loop current verification circuitry 124 must take into account measurement errors that affect the measured loop current value 142. Failure to take into account such measurement errors can lead to diagnostic signals 144 that falsely indicate an error in the process device 102.

Figure 4:
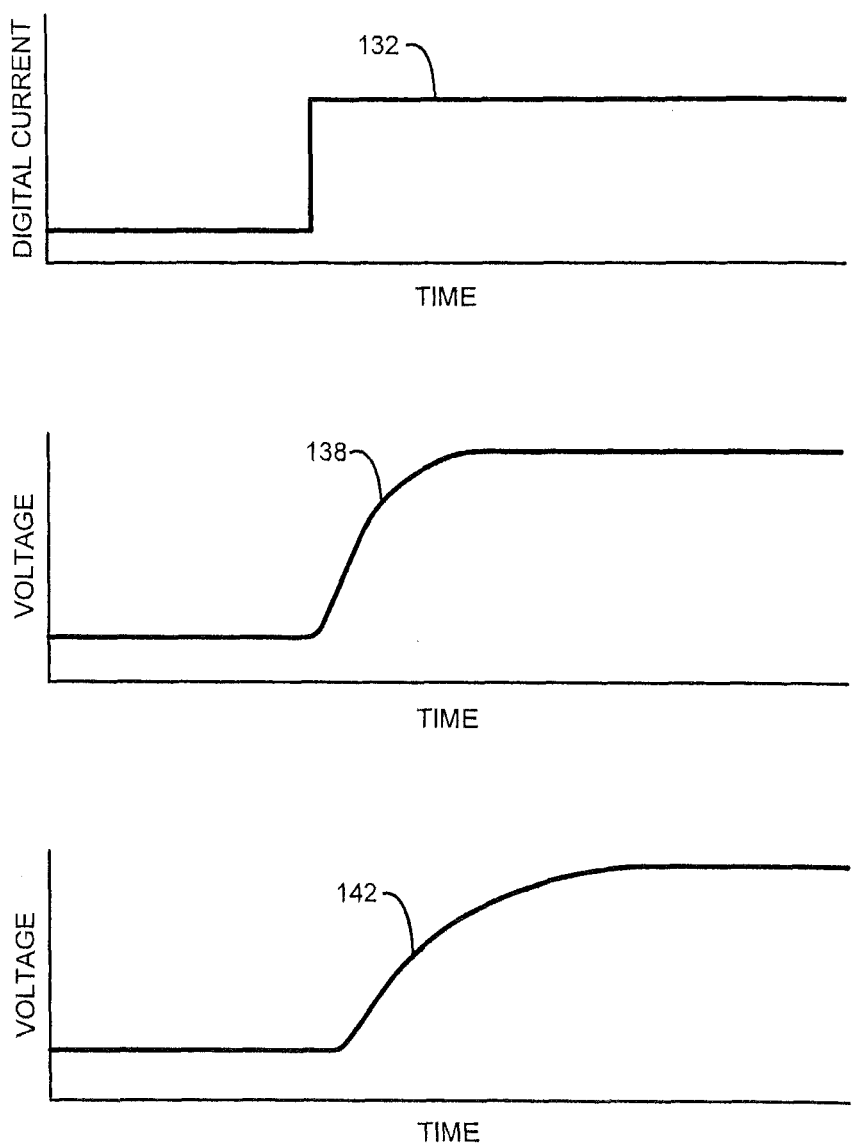
FIG. 4 includes three charts of exemplary signals in a process device.

Embodiments of the invention operate to address dynamic measurement errors that generally occur when the sensor output signal 126 changes in response to a change in the process variable. Such a change in the sensor output signal 126 produces a step change in the voltage of the digital measured value 132, such as indicated in the top chart provided in FIG. 4. The resultant analog measured value 138 that is produced in response to the step change in the voltage of the digital measured value 132 is shown in the middle chart of FIG. 4. The analog measured value 138 has a dynamic measurement error corresponding to the difference between its value and the digital measured value 132. This error is magnified further by the loop current measurement circuitry 140 as indicated by the measured loop current value 142 shown in the bottom chart of FIG. 4. The resultant dynamic error between the digital measured value 132 and the measured loop current value 142 is generally caused by the low pass filters 150 and 156. Unless accounted for, this dynamic error can cause the generation of diagnostic signals 144 that falsely indicate an error in the process device 102.

Figure 5:
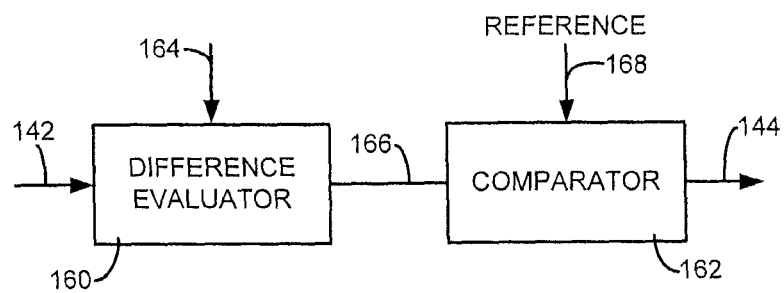
FIG. 5 is a simplified diagram of loop current verification circuitry in accordance with embodiments of the invention.

FIG. 5 is a simplified diagram of loop current verification circuitry 124 in accordance with embodiments of the invention. In some embodiments, the loop current verification circuitry 124 includes a difference evaluator 160 and a comparator 162. The difference evaluator 160 establishes a difference between the measured loop current value 142 and an approximate loop current value 164. The value difference 166 is output to the comparator 162, which compares the difference value 166 to a reference 168 and outputs the diagnostic signal 144 responsive to the comparison. The reference 168 represents the one or more values that may be used to trigger various diagnostic signals 144, such as a set threshold error value, as discussed above. The reference 168 may be retrieved from memory of the process device 102, such as memory 134. As with other modules of the device 102 presented herein, the difference evaluator 160 and the comparator 162 may be implemented in the process device 102 through hardware or software executed by the one or more processors of the microcontroller 130, for example.

The approximate loop current value 164 is generated based on the digital measured value 132 and properties of the low pass filters 150 and 156 to approximate the dynamic measurement error. The resultant value difference 166 between the measured loop current value 142 and the approximate loop current value 164 output from the difference evaluator 160, is a better indicator of actual error in the device 102 during periods in which the digital measured value 132 is changing than would be possible using the digital measured value 132.

Figure 6:
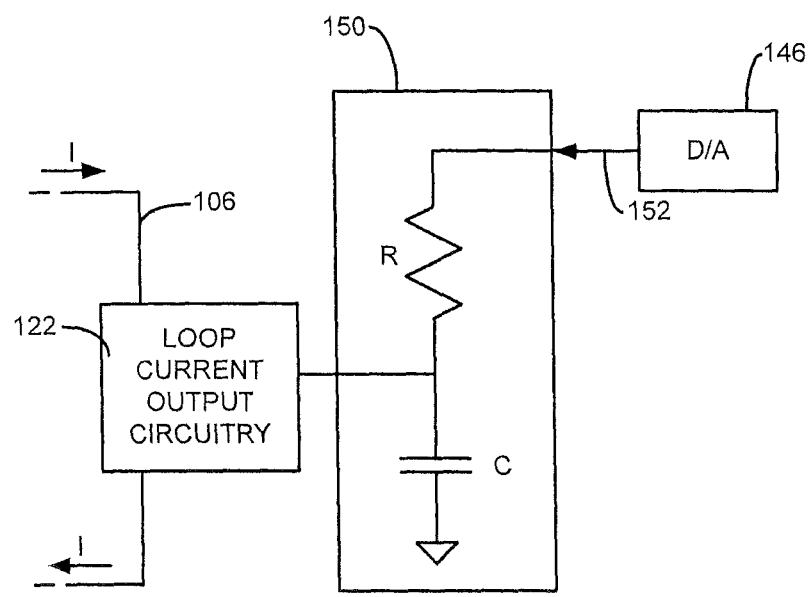
FIG. 6 is a simplified diagram of an exemplary low pass filter in accordance with embodiments of the invention.

In one embodiment, the approximated digital loop current value 164 takes into account the time constants of the low pass filters 150 and 156. FIG. 6 is a simplified diagram of an exemplary low pass filter that could be used for filters 150 and 156, and is depicted as low pass filter 150. The low pass filter 150 includes a resistance R in series with the loop current output circuitry 122, and a capacitor C in parallel with the loop current output circuitry 122. The capacitor C exhibits reactance and blocks the low-frequency signals from the digital-to-analog converter 146, causing them to travel to the loop current output circuitry 122. The reactance of the capacitor C drops with higher frequency signals output from the digital-to-analog converter 146 causing the capacitor C to effectively function as a short circuit to ground, thereby filtering the higher frequency noise. As understood by those skilled in the art, the time constant of the low pass filter is based on the product of the resistance R and the capacitance C.

Figure 7:
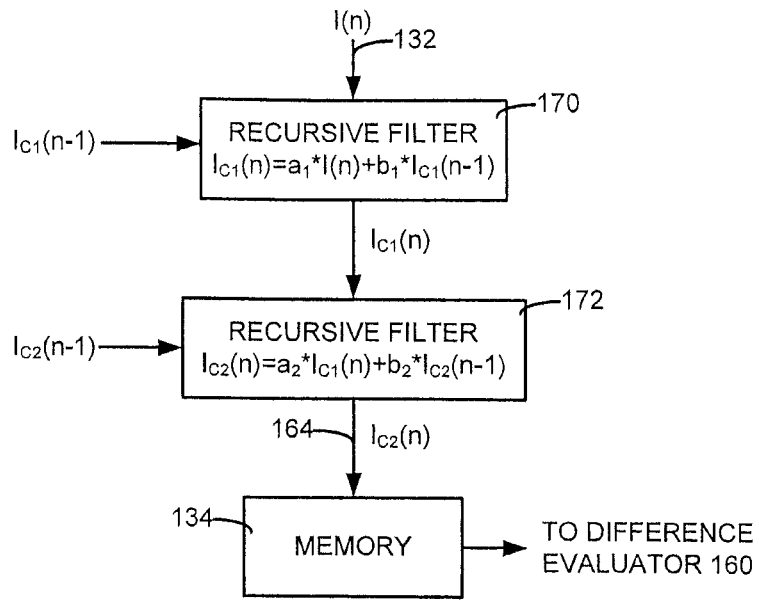
FIGS. 7 and 8 illustrate methods of calculating an approximate loop current value in accordance with embodiments of the invention.

In some embodiments, the loop current verification circuitry 124 calculates the approximate loop current value 164 using a pair of recursive filters 170 and 172, as illustrated schematically in FIG. 7. The recursive filters 170 and 172 may be implemented in software stored in the memory 134, or other memory of the process device 102 that is executed by the one or more processors of the microcontroller 130. Alternatively, the filters 170 and 172 may be implemented in hardware.

The recursive filter 170 receives digital samples of the digital measured value 132 (I(n)) and outputs a corrective sample $I_{C1}(n)$ based on the digital measured value sample I(n), the previous corrected sample $I_{C1}(n-1)$ and values $a_1$ and $b_1$, which are calculated based on the time constant of the low pass filter 150, as indicated in Equation 1. In one embodiment, the recursive filter 170 receives the previous digital measured value sample I(n-1) and the previous corrected sample $I_{C1}(n-1)$ from memory of the process device 102, such as memory 134.

$$I_{C1}(n)=a_1*I(n)+b_1*I_{C1}(n-1) \qquad \text{Eq. 1}$$

The recursive filter 172 receives the corrected samples $I_{C1}$ from the recursive filter 170 and calculates the approximate loop current value 164 sample $I_{C2}(n)$ corresponding to the digital measured value sample I(n) based upon the corrected digital measured value sample $I_{C1}(n)$, the previous approximate digital measured value $I_{C2}(n-1)$, and values $a_2$ and $b_2$, which are calculated based on the time constant of the low pass filter 156, as indicated in Equation 2. In one embodiment, the recursive filter 172 receives the previous approximate loop current value $I_{C2}(n-1)$ from memory of the process device 102, such as memory 134.

$$I_{C2}(n)=a_2*I_{C1}(n)+b_2*I_{C2}(n-1) \qquad \text{Eq. 2}$$

In some embodiments, the values for $a_1$, $b_1$, $a_2$ and $b_2$ are calculated in accordance with Equations 3 and 4 based on the time constants of the low pass filters 150 and 156. D is the time constant expressed in quantity of time intervals and is equal to T/M, where M is a recursive filter recalculation period and T is time constant of the hardware filter.

$$a = 1 - b \qquad \text{Eq. 3}$$

$$b = \exp^{(-1/D)} \qquad \text{Eq. 4}$$

Approximate loop current value samples 164 ($I_{C2}$) output from the recursive filter 172 are then provided to the difference evaluator 160 (FIG. 5) to be used in the calculation of the value difference 166. In some embodiments, the approximate loop current value samples 164 ($I_{C2}$) are retrieved from memory 134 of the process device 102 or other memory within the process device 102.

Each of the approximate loop current value samples 164 ($I_{C2}(n)$) provide a reasonable approximation of the dynamic error caused by low pass filters 150 and 156. As a result, the approximate loop current value samples 164 represent the value that the measured loop current value 142 should be if the process device 102 is functioning properly. Thus, the approximate loop current value samples 164 allow the loop current verification circuitry 124 to conduct a more accurate assessment of the health of the process device 102 than would be possible without compensating the digital measured values 132 based on the properties of the low pass filters 150 and 156.

Figure 8:
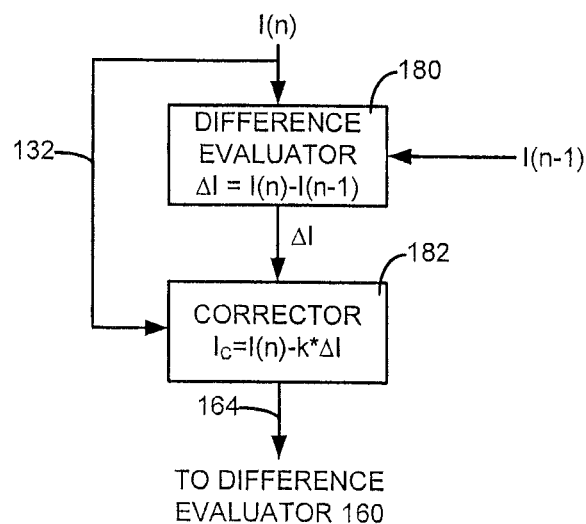

Another technique for calculating the approximate loop current value samples 164 that may be implemented by the loop current verification circuitry 124 is illustrated in FIG. 8. In some embodiments, the loop current verification circuitry 124 includes a difference evaluator 180 and a corrector 182. The difference evaluator 180 and the corrector 182 may be implemented in software stored in memory of the device 102, such as memory 134 that is executable by the one or more processors of the microcontroller 130, for example. Alternatively, the difference evaluator 180 and/or the corrector 182 may be implemented in the hardware of the process device 102.

In some embodiments, the difference evaluator 180 receives the current digital measured value 132 (I(n)) and the previous digital measured value sample (I(n−1)), and calculates a change in the digital measured value (ΔI=I(n)−I(n−1)). The previous digital measured value sample I(n−1) may be retrieved from memory of the process device 102, such as memory 134.

The difference evaluator 180 outputs the change in the digital measured value sample ΔI to the corrector 182. The corrector 182 also receives the current digital measured value sample I(n) and a correction factor k, and calculates the approximate loop current value 164 ($I_C$) in accordance with Equation 5. The correction factor k may be retrieved from memory of the process device 102, such as memory 134, and is based upon properties of the low pass filters 150 and 156. In some embodiments, the loop current verification circuitry 124 is triggered to perform this diagnostic evaluation responsive to a change in the digital measured value 132.

$$I_C(n) = I(n) - k * \Delta I = I(n) - k * (I(n) - I(n-1)) \qquad \text{Eq. 5}$$

In some embodiments, the correction factor k is determined during the manufacture of the process device 102 and generally corresponds to the slope of the measured loop current value 142 when the digital measured value transitions from its minimum to its maximum value. In some embodiments, the correction factor k is a function of the period of time between the update to the digital-to-analog converter 146 and the update to the analog-to-digital converter 158 less a constant.

Figure 9:
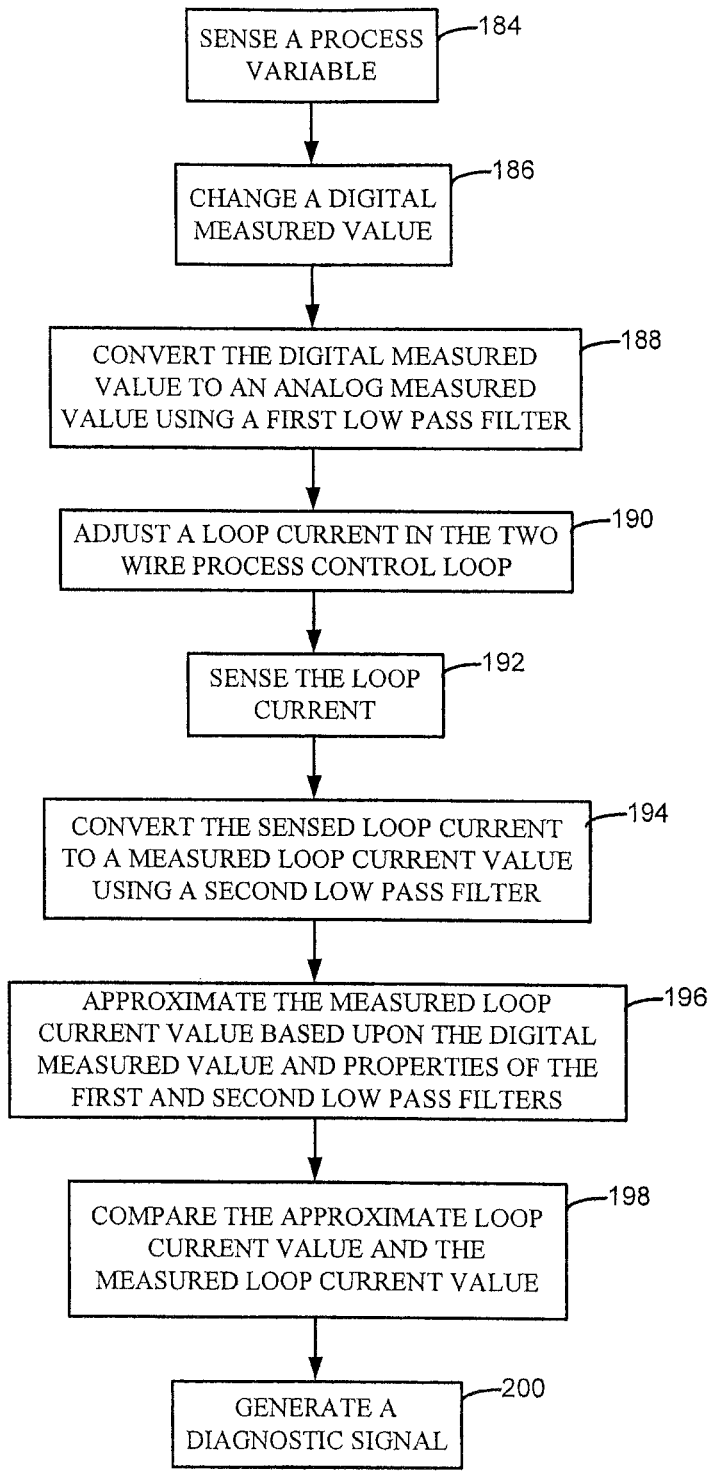
FIG. 9 is a flowchart illustrating a method in a process device for verifying loop current in a two wire process control loop in accordance with embodiments of the invention.

FIG. 9 is a flowchart illustrating a method in a process device 102 for verifying loop current in a two wire process control loop in accordance with embodiments of the invention. At 184, a process variable is sensed using a sensor 120 of a process device 102, as shown in FIG. 3. At 186, a digital measured value 132 is changed from a first value to a second value as a function of the sensed process variable, as illustrated in the top chart of FIG. 4. The digital measured value 132 is then converted to an analog measured value 138 using a first low pass filter 150 (FIG. 3), at 188. In one embodiment, the low pass filter 150 is a component of a digital-to-analog conversion circuitry 136 that receives an output signal 152 from a digital-to-analog converter 146, as shown in FIG. 3.

At 190, a loop current I in the two wire process control loop 106 is adjusted. In some embodiments, this adjustment to the loop current I is performed by the loop current output circuitry 122 as a function of the analog measured value 138.

At 192, the loop current I is sensed. In some embodiments, this sensing of the loop current I is performed by the current sensor 154 of the loop current measurement circuitry 140, which produces an output that is indicative of the loop current I. At 194, the sensed loop current is converted to a measured loop current value 142 using a second low pass filter 156. As discussed above, the low pass filter 156 removes high frequency signals from the sensed loop current and provides the filtered sensed loop current to an analog-to-digital converter 158 to produce the measured loop current value 142.

At 196, the measured loop current value 142 is approximated based upon the digital measured value 132 and properties of the first and second low pass filters 150 and 156 to generate an approximate loop current value 164. In some embodiments, step 196 is performed using the recursive process described above with reference to FIG. 6. In some embodiments, step 196 is performed in accordance with the process described above with regard to FIG. 7.

At 198, the approximate loop current value 164 is compared to the measured loop current value 142. At 200, a diagnostic signal 144 is generated based on the comparison. In some embodiments, step 198 is performed by loop current verification circuitry 124, as shown in FIG. 5. As discussed above, the diagnostic signal 144 generated in step 200 may be used to indicate an error in the loop current I or the process device 102, for example.

In some embodiments, the diagnostic signal 144 triggers the issuance of a warning. The warning may take the form of an audible and/or visible alarm, a message (e.g., email, text message, etc.), and/or other warning.

In some embodiments, the diagnostic signal 144 is used as compensation for the detected error. For instance, the diagnostic signal 144 may be fed back to the microcontroller 130, which can adjust the digital measured value 132 to compensate for the error.

Embodiments of the invention relate to loop current diagnostics in a process device. Some embodiments are directed to a process device that comprises digital-to-analog conversion circuitry, loop current output circuitry, loop current measurement circuitry and loop current verification circuitry. The digital-to-analog conversion circuitry is configured to convert a digital measured value corresponding to a sensed parameter to an analog measured value. In one embodiment, the digital-to-analog conversion circuitry includes a first low pass filter. The loop current output circuitry is configured to control a loop current on a two wire process control loop as a function of the analog measured value. The loop current measurement circuitry is coupled to the process control loop and is configured to generate a digital loop current value based on the loop current. In one embodiment, the measurement circuitry includes a second low pass filter. The loop current verification circuitry is configured to approximate the digital loop current value based on the digital measured value and properties of the first and second low pass filters. Additionally, the loop current verification circuitry is configured to generate a diagnostic signal based on a comparison of the approximated digital loop current value to the digital loop current value.

Some embodiments are directed to a method in a process device for verifying loop current in a two wire process control loop. In the method, a process variable is sensed. A digital measured value is changed from a first value to a second value as a function of the sensed process variable. The digital measured value is then converted to an analog measured value using a first low pass filter. A loop current in the two wire process control loop is adjusted as a function of the analog measured value. The loop current in the two wire process control loop is sensed and the sensed loop current is converted to a digital loop current value using a second low pass filter. The digital loop current value is approximated based upon the digital measured signal and properties of the first and second low pass filters. A diagnostic signal is generated based on a comparison of the approximated digital loop current value to the digital loop current value.

Although the present invention has been described with reference to preferred embodiments, workers skilled in the art will recognize that changes may be made in form and detail without departing from the spirit and scope of the invention.

What is claimed is:
1. A process device comprising:
a process variable sensor configured to generate an output signal indicative of a sensed process variable;
loop current output circuitry configured to control a loop current on a two wire process control loop to a value based on the output signal processed by a first low pass filter wherein the first low pass filter introduces a first error in loop current in response to a step change in the sensed process variable;
loop current measurement circuitry coupled to the process control loop and configured to generate a measured loop current value based on the loop current, and as a function of a second low pass filter, wherein the second low pass filter introduces a second error in the measured loop current value in response to the step change in the sensed process variable; and
loop current verification circuitry configured to compensate for the first and second errors based on the measured loop current value and properties of the first and second low pass filters, and generate a diagnostic signal based on a comparison of an approximated loop current value and the measured loop current value.

2. The process device of claim 1, including:
a digital-to-analog conversion circuitry configured to convert a digital measured value representative of the output signal to an analog measured value, the conversion circuitry including the low pass filter;
wherein the loop current output circuitry is configured to control the loop current as a function of the analog measured value; and
wherein the loop current verification circuitry is configured to approximate the loop current value based on properties of the first low pass filter.

3. The process device of claim 2, wherein the loop current verification circuitry is configured to approximate the loop current value based on a time constant of the low pass filter.

4. The device of claim 1, wherein the loop current verification circuitry is configured to approximate the loop current value based on a time constant of the second low pass filter.

5. The process device of claim 4, wherein the loop current verification circuitry is configured to recursively generate the approximated loop current value ($I_{C2}(n)$) based on the following equations:

$$I_{C1}(n) = a_1 * I(n) + b_1 * I_{C1}(n-1); \text{ and}$$

$$I_{C2}(n) = a_2 * I_{C1}(n) + b_2 * I_{C2}(n-1);$$

wherein n represents the current sample, $I_{C1}$ represents output from a first recursive filter, $I_{C2}$ represents the approximate loop current value sample output from a second recursive filter, n−1 represents the preceding sample, I is the digital measured value, $a_1$ and $b_1$ are calculated based on a time constant of the first low pass filter, and $a_2$ and $b_2$ are calculated based on a time constant of the second low pass filter.

6. The device of claim 1, wherein the loop current verification circuitry comprises:
a difference evaluator having an error estimate output corresponding to a difference between the measured loop current value and the approximated loop current value; and
a comparator configured to compare the error estimate output and a reference, and output the diagnostic signal responsive to the comparison.

7. The process device according to any of claim 1, wherein:
the device comprises a digital-to-analog conversion circuit configured to convert a digital measured value representative of the output signal to an analog measured value;
the loop current output circuitry is configured to control the loop current as a function of the analog measured value; and
the loop current verification circuitry is configured to approximate the loop current value based on a correction factor stored in a memory.

8. The process device of claim 7, wherein the loop current verification circuitry is configured to approximate the loop current value based on the following equation:

$$I_C(n) = I(n) - k * \Delta I = I(n) - k * (I(n) - I(n-1));$$

wherein $I_C$ is the approximate loop current value, k is the correction factor, n represents the current sample, n−1 represents the preceding sample, and I is the digital measured value.

9. The process device according to claim 1, wherein the two wire process control loop is a 4-20 milliamp loop.

10. The process device according to claim 1, wherein the process device is powered by the two wire process control loop.

11. A method in a process device for verifying loop current in a two wire process control loop comprising:
sensing a process variable;
changing a digital measured value from a first value to a second value as a function of the sensed process variable;
converting the digital measured value to an analog measured value using a first low pass filter;
adjusting a loop current in the two wire process control loop as a function of the analog measured value wherein the first low pass filter introduces a first error in loop current in response to a step change in the sensed process variable;
sensing the loop current in the two wire process control loop;
converting the sensed loop current to a measured loop current value using a second low pass filter wherein the second low pass filter introduces a second error in the measured loop current value in response to the step change in the sensed process variable;

compensating for the first and second errors based upon the measured loop current value and properties of the first and second low pass filters and generating for the first and second errors; and generating a diagnostic signal based on a comparison of the approximated loop current value to the measured loop current value.

12. The method of claim 11, wherein approximating the measured loop current value comprises recursively generating the approximated loop current value ($I_{C2}$) based on the following equations:

$$I_{C1}(n) = a_1 * I(n) + b_1 * I_{C1}(n-1); \text{ and}$$

$$I_{C2}(n) = a_2 * I_{C1}(n) + b_2 * I_{C2}(n-1);$$

wherein n represents the current digital sample, n−1 represents the preceding digital sample, I is the digital measured value, $a_1$ and $b_1$ are calculated based on a time constant of the first low pass filter, and $a_2$ and $b_2$ are calculated based on a time constant of the second low pass filter.

13. The method of claim 12, further comprising retrieving the values for $a_1$, $b_1$, $a_2$ and $b_2$ from memory.

14. The method of claim 11, wherein approximating the measured loop current value comprises applying a correction factor that is based on properties of the first and second low pass filters to the digital measured value.

15. The method of claim 14, further comprising retrieving the correction factor from memory of the process device.

* * * * *